United States Patent [19]

Ogura

[11] 4,349,242
[45] Sep. 14, 1982

[54] SPECIMEN OBSERVATION APPARATUS INCLUDING AN OPTICAL MICROSCOPE AND A SCANNING ELECTRON MICROSCOPE

[75] Inventor: Kazumichi Ogura, Akishimashi, Japan

[73] Assignee: Nihon Denshi Kabushiki Kaisha, Tokyo, Japan

[21] Appl. No.: 234,175

[22] Filed: Feb. 13, 1981

[30] Foreign Application Priority Data

Feb. 15, 1982 [JP] Japan ............................ 55-17967[U]

[51] Int. Cl.³ ............................................ G02B 21/00
[52] U.S. Cl. ...................................... 350/81; 350/87; 250/310
[58] Field of Search ..................... 350/8, 87, 86, 81; 250/310, 442, 441

[56] References Cited

U.S. PATENT DOCUMENTS

| | | | |
|---|---|---|---|
| 3,150,255 | 9/1964 | Wilska | 350/8 |
| 3,169,183 | 2/1965 | Radtke et al. | 350/86 |
| 3,371,185 | 2/1968 | Anderson | 350/81 |
| 3,378,670 | 4/1968 | Smith et al. | 350/81 |
| 3,761,709 | 9/1973 | Hasegawa et al. | 250/442 |

FOREIGN PATENT DOCUMENTS 397827  2/1974  U.S.S.R. ............................ 250/310

Primary Examiner—Jon W. Henry
Attorney, Agent, or Firm—Webb, Burden, Robinson & Webb

[57] ABSTRACT

A specimen observation apparatus for obtaining both an optical microscope image and a scanning electron microscope image simultaneously from one specimen. The apparatus includes a transparent glass plate having a transparent electrically conductive layer on a surface thereof for supporting the specimen in a vacuum column. The glass plate seals off one end of the vacuum column. The specimen position is illuminated with light and an electron beam along the same optical axis in the vacuum column to create both an optical microscope image with the light passing through the specimen and a scanning electron microscope image based on information obtained by scanning the electron beam over the specimen. The glass plate, while sealing one end of the vacuum column, is movably disposed about the optical axis. An optical microscope is located outside the vacuum column near to the glass plate.

5 Claims, 2 Drawing Figures

SPECIMEN OBSERVATION APPARATUS INCLUDING AN OPTICAL MICROSCOPE AND A SCANNING ELECTRON MICROSCOPE

BACKGROUND OF THE INVENTION

This invention relates to a specimen observation apparatus capable of obtaining both an optical microscope image and a scanning electron microscope image from one specimen simultaneously.

For observing biological specimens such as cells, it has been the recent practice to make comparison between an image obtained from an optical microscope (hereinafter referred to a "OM") and an image obtained from a scanning electron microscope (hereinafter referred to as "SEM"). An apparatus has been previously proposed for observing one region on one specimen at one time with both OM and SEM. Such apparatus includes a transparent glass plate having a transparent and electric conductive layer on a surface thereof for supporting a specimen in a vacuum column. The specimen is illuminated with light to create thereby an OM image with the light passing through the specimen. At the same time, the specimen is illuminated with electron beam to create thereby a SEM image based on information obtained by scanning the electron beam over the specimen. However, since at least the objective lens section of the OM is fixedly arranged adjacent to the glass plate with the vacuum column, the magnification of the OM image is not freely variable. The objective lens determines the magnification of the OM image. Nevertheless, it is necessary to provide a selection of magnifications to meet a variety of specimens. Changing the magnifications of the OM image would be a troublesome, time-consuming operation that involves breaking the vacuum in the vacuum column or specimen chamber and replacing the objective lens with another.

Accordingly, an object of this invention is to provide a specimen observation apparatus for enabling easy selection of the OM image magnification without breaking the vacuum within the column.

SUMMARY OF THE INVENTION

Briefly, according to this invention, a specimen observation apparatus is provided with a transparent glass plate having a transparent and electric conductive layer on a surface thereof for supporting a specimen, which is illuminated with light and an electron beam along the same optical axis in a vacuum column to create both an OM image with the light passing through the specimen and a SEM image based on information obtained by scanning the electron beam over the specimen. Further, in the apparatus, the glass plate is movably disposed near the optical axis at an open end of the vacuum column by means of the vacuum seal member. An optical microscope is located adjacent to said glass plate on its atmospheric side thereof.

THE DRAWINGS

DESCRIPTION OF THE PREFERRED EMBODIMENT

Figure 1:
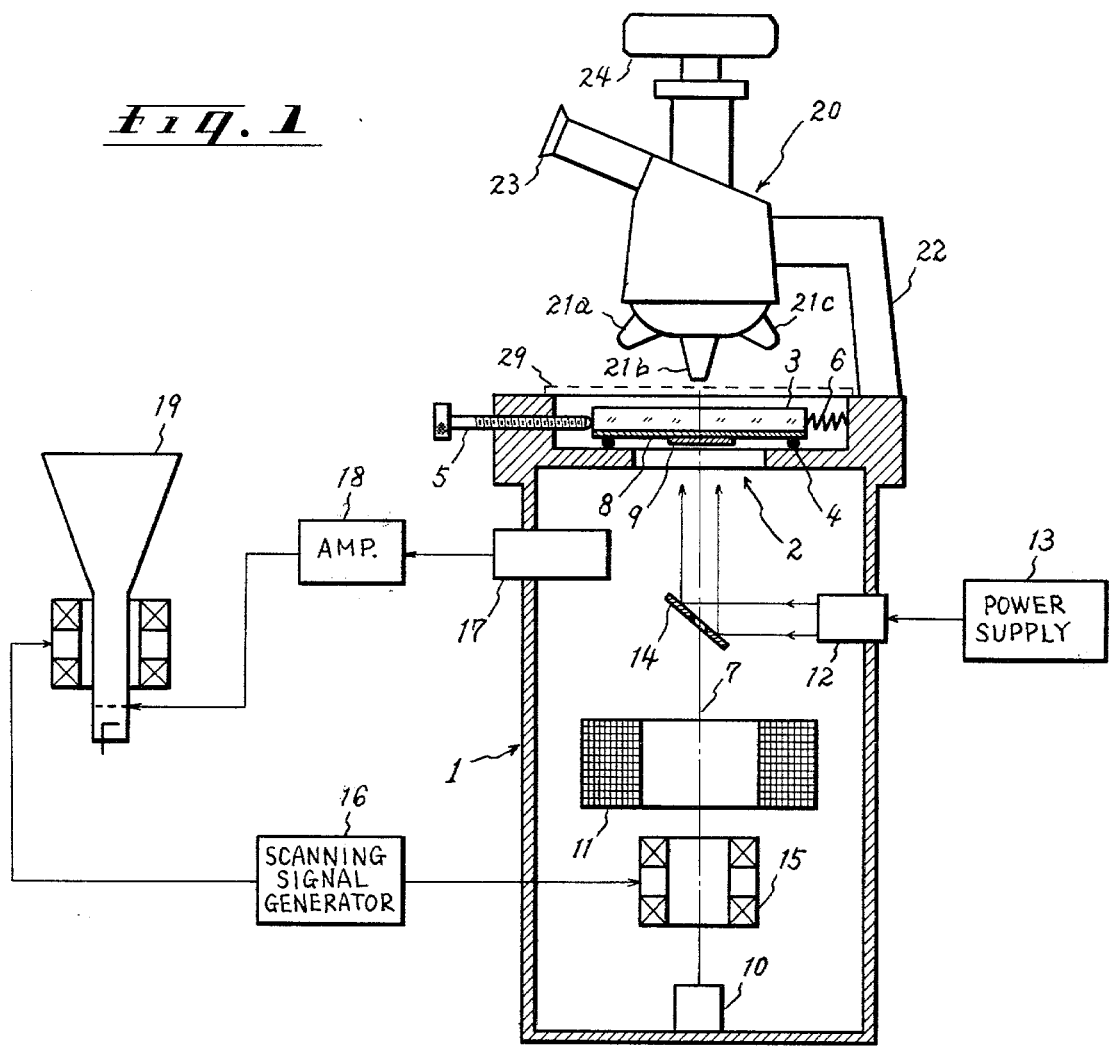
FIG. 1 is a schematic drawing showing one embodiment of this invention.

FIG. 1 is a schematic view of a specimen observation apparatus according to an embodiment of the invention. (The basics of optical microscopy and scanning electron microscopy being well known, they are illustrated schematically in the drawing. The details essential to an understanding of this invention are carefully illustrated.) A vacuum column 1 has an upper central opening 2 and is connectable to a vacuum pump (not shown) to be exhausted as is the practice for electron microscopes. A transparent glass plate 3 is disposed over the opening 2 of the vacuum column 1 by an O-ring packing (ring-shaped vacuum seal member) 4 which blocks the passage of air between the interior and exterior of the vacuum column 1. The glass plate has one edge pressed in an X-direction perpendicular to the optical axis 7 by a screw 5. The plate is biased against the screw 5 by a spring 6 pressing on an opposite edge. Although not shown, similar arrangements are located in the Y-direction perpendicular to the optical axis 7. On the interior side of the glass plate 3, a transparent and electrically conductive layer 8 about 0.05~0.1 $\mu$m thick is formed. The layer 8 comprises, for example, an oxide of indium (In) or tin (Zn) which may be coated on the glass plate by a vacuum evaporation and deposition process. A specimen is attached to the layer 8 which is maintained at ground potential. An electron beam is emitted from an electron gun 10 and focused by electron lens 11 onto the specimen 9 through the small central opening of a reflection mirror 14 and along the optical axis 7. At the same time, light is emitted from a light source 12 controlled by a power supply 13 and illuminates the specimen along the optical axis 7 simultaneously or alternately with the electron beam via the reflection mirror 14 disposed in a path of the electron beam. The electron beam irradiating the specimen scans the specimen surface two-dimensionally by deflection coils 15 which is supplied with a scanning signal from a scanning signal generator 16. The electron beam scanning causes the specimen 9 to produce information (by way of secondary electrons, backscattered electrons, Auger electrons, X-ray, for example) which is detected by a detector 17. The signal detected by the detector 17 is fed via an amplifier 18 as a brightness modulation signal to an image display means (cathode ray tube) 19, deflection means of which is supplied with the scanning signal from the scanning signal generator 16 in synchronism with the electron beam scanning over the specimen surface. Thus, the specimen image (secondary electron image, backscattered electron image, Auger electron image, X-ray image, or the like) is displayed on the screen of the image display means 19.

In FIG. 1, an optical microscope 20 is arranged adjacent to the glass plate 3 on its atmospheric side by means of an arm 22, and any one of objective lenses 21a, 21b, 21c may be located on the optical axis 7 in close proximity to the glass surface. Indicated at 23 is an eye lens, and at 24 is a camera attached to the microscope. The light illuminating the specimen 9 is absorbed at different degrees by different portions of the specimen and then passes through the transparent and electric conductive layer 8 and the glass plate 3 before going into the objective lens (a selected one of the lenses 21a, 21b, 21c) of the optical microscope 20. As a result, the operator can observe an OM image of the specimen through the eye lens. Additionally, when an OM image observation is not necessary, it is preferable to cover the upper central opening 2 with the cover shown by broken line 29 in FIG. 1 so that the light which passes through the opening 2 and irradiates the detector 17 is obstructed. By so doing, the noise signal in the SEM image is decreased.

Figure 2:
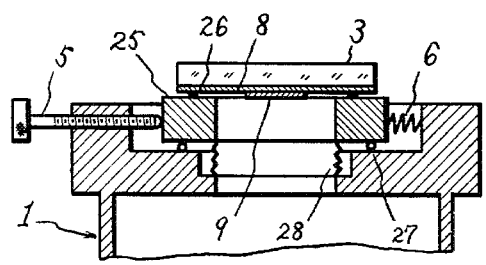
FIG. 2 is a schematic drawing showing the essential part of another embodiment of this invention.

FIG. 2 is a schematic drawing showing the essential part of another embodiment of the invention. In this embodiment, an annular stage 25 is incorporated between the glass plate 3 and the open end of the vacuum column 1. The glass plate 3 is supported fixedly via O-ring packing 26 on the annular stage 25. The annular stage 25 is supported by balls 27 (or other slide members) on the open end of the vacuum column 1 and is movable by the screw 5 held against one edge of the stage 25 with the opposite edge being urged by the spring 6. The vacuum seal between the annular stage 25 and the vacuum column 1 is kept by bellows 28.

Having thus described the invention with the detail and particularity required by the Patent Laws, what is desired protected by Letters Patent is set forth in the following claims:

1. In a specimen observation apparatus comprising a vacuum column, an optical microscope, a transparent glass plate having a transparent and electrically conductive layer on a surface thereof for supporting a specimen at a specimen position, means for illuminating the specimen position with light and an electron beam along the same optical axis in said vacuum column to create an optical microscope image with the light passing through the specimen and a scanning electron microscope image based on information obtained by scanning the electron beam over the specimen, the improvement comprising said glass plate being movably disposed near the optical axis at one end of the vacuum column and with a vacuum seal member sealing the column from the atmosphere, said optical microscope being located near said glass plate external to said column.

2. The improvement according to claim 1 wherein the seal member comprises a large O-ring gasket.

3. The improvement according to claim 1 wherein the column has an apertured end wall perpendicular to said optical axis and said seal means comprises an O-ring laying against the external surface of the end wall circumscribing the aperture, said O-ring being sandwiched between the end wall and glass plate.

4. The improvement according to claims 2 or 3 wherein screws threaded to said column bear upon the edge of the glass plate and may position the glass plate relative to the optical axis when a vacuum has been drawn upon the column.

5. In a specimen observation apparatus comprising a vacuum column, an optical microscope, a transparent glass plate having a transparent and electrically conductive layer on a surface thereof for supporting a specimen at a specimen position, means for illuminating the specimen position with light and an electron beam along the same optical axis in said vacuum column to create an optical microscope image with the light passing through the specimen and a scanning electron microscope image based on information obtained by scanning the electron beam over the specimen, the improvement comprising said glass plate supported on an annular stage having an aperture therein, said stage movably disposed near the optical axis at an open end of the vacuum column, a vacuum seal bellows extending between the vacuum column and the stage, means for moving the stage relative to said optical axis, said glass plate sealing off the aperture in said stage, and said optical microscope being located near to said glass plate external said vacuum column.

* * * * *

UNITED STATES PATENT AND TRADEMARK OFFICE
CERTIFICATE OF CORRECTION

PATENT NO. : 4,349,242
DATED : September 14, 1982
INVENTOR(S) : Kazumichi Ogura

It is certified that error appears in the above-identified patent and that said Letters Patent are hereby corrected as shown below:

On The Title Page,
<u>Foreign Application Priority Data</u>

"Feb. 15, 1982" should read --Feb. 15, 1980--.

Column 1 Line 15 "a" should read --as--.

Signed and Sealed this

Twenty-third Day of November 1982

[SEAL]

Attest:

Attesting Officer

GERALD J. MOSSINGHOFF
Commissioner of Patents and Trademarks